United States Patent
Liu et al.

(10) Patent No.: US 11,022,655 B2
(45) Date of Patent: Jun. 1, 2021

(54) METHOD AND CONTROL SYSTEM FOR FAULTED PHASE DETECTION

(71) Applicant: ABB Power Grids Switzerland AG, Baden (CH)

(72) Inventors: Kai Liu, Beijing (CN); Jianping Wang, Västerås (SE); Youyi Li, Västerås (SE)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 236 days.

(21) Appl. No.: 16/174,701

(22) Filed: Oct. 30, 2018

(65) Prior Publication Data
US 2019/0072603 A1  Mar. 7, 2019

Related U.S. Application Data

(63) Continuation of application No. PCT/CN2016/113584, filed on Dec. 30, 2016.

(51) Int. Cl.
*G01R 31/50* (2020.01)
*H02H 7/26* (2006.01)
(Continued)

(52) U.S. Cl.
CPC .......... *G01R 31/50* (2020.01); *G01R 31/085* (2013.01); *H02H 3/165* (2013.01); *H02H 7/26* (2013.01);
(Continued)

(58) Field of Classification Search
CPC .......... H02H 3/165; H02H 3/385; H02H 7/26; G01R 31/085; G01R 31/50; G01R 31/52; G01R 19/2513
(Continued)

(56) References Cited

U.S. PATENT DOCUMENTS

2013/0107405 A1    5/2013  Blumschein et al.

FOREIGN PATENT DOCUMENTS

| CN | 101252273 A | 8/2008 |
| CN | 102288874 A | 12/2011 |

(Continued)

OTHER PUBLICATIONS

Intellectual Property Office of the P.R. China, International Search Report & Written Opinion issued in corresponding Application No. PCT/CN2016/113584, dated Oct. 17, 2017, 9 pp.

*Primary Examiner* — Kevin J Comber
(74) *Attorney, Agent, or Firm* — Slater Matsil, LLP

(57) ABSTRACT

A method, control system and protective relay are provided for detecting faulted phases of transmission lines in an AC power system. The method includes sampling electric signals at one end of the transmission lines at a series of time points; computing instantaneous voltage values of electric signals at compensated points on the transmission lines from the values of the sampled electric signals based on a time domain lumped parameter differential equation for the transmission lines for the series of time points; recording the computed instantaneous voltage values of the electric signals; computing fault component or sudden-change of the instantaneous voltage values of the electrical signals; detecting the faulted phases or fault types by comparing the calculated fault component of the instantaneous voltage values at the preset compensated points; and generating signals indicating the faulted phases of fault types.

24 Claims, 12 Drawing Sheets

(51) Int. Cl.
*G01R 31/08* (2020.01)
*H02H 3/16* (2006.01)
*G01R 19/25* (2006.01)
*H02H 3/38* (2006.01)

(52) U.S. Cl.
CPC ......... *G01R 19/2513* (2013.01); *H02H 3/385* (2013.01)

(58) Field of Classification Search
USPC .......................................................... 361/47
See application file for complete search history.

(56) References Cited

FOREIGN PATENT DOCUMENTS

| | | |
|---|---|---|
| CN | 102354962 A | 2/2012 |
| CN | 102985836 A | 3/2013 |
| CN | 103207353 A | 7/2013 |
| CN | 103245887 A | 8/2013 |
| CN | 104535890 A | 4/2015 |
| KR | 101463045 B1 | 11/2014 |

METHOD AND CONTROL SYSTEM FOR FAULTED PHASE DETECTION

TECHNICAL FIELD

The invention relates to protection relay of AC power system, and more particularly to faulted phase detection for protection relay of AC power system.

BACKGROUND ART

Faulted phase detection which is also called faulted phase selection, fault classification or fault type detection is an important function for protection relay, especially for single-pole tripping power system. Normally, the faulted phase detection is based on the comparison of the fault component currents or voltages from different phases, or based on the comparison of currents or voltages from different sequences.

But the sensitivities of these methods are influenced greatly by the SIR of the power system. For example, the faulted phase detection based on fault component phase voltages will fail to operate if the SIR is close to zero, when the power system is too strong and the fault component voltages at the ends of the transmission lines are too small. Voltage compensation is used to resolve this sensitivity problem. There are mainly two kinds of voltage compensation methods at present. One of the voltage compensation methods is based on lumped parameter, fundamental frequency phasors and Ohm's law. This method is widely used but it is not suitable for the time-domain protections. Another compensation method is based on distributed parameter, sampling values and travelling wave transmitting formula, as described in "Fault Phase Selector by Fault Component of Compensation Voltage Based on Traveling Wave", LI You-yi, DONG Xin-zhou, and SUN Yuan-zhang, Automation of Electric Power Systems, 2006, 30 (8), page 37-40. This method is designed for time domain protections and travelling wave protections, but it needs much higher sampling rate to achieve enough calculation accuracy, which increases the cost and technical challenge for product implementation.

BRIEF SUMMARY OF THE INVENTION

Present invention provides another kind of faulted phase detection method and system based on a lumped parameter, sampling values and differential equation for the transmission lines. This method has good sensitivity for differential SIR conditions thanks to the voltage compensation. And furthermore, it is also a low-cost solution because it can be based on the low sampling rate like 1 k Hz.

According to one aspect of present invention, it provides a method for detecting faulted phase of transmission line in an AC power system, including: detecting the sampling values of voltages and currents at one end of the transmission line at a series of time points; computing the instantaneous voltage values at a preset compensated point on the transmission line based on the sampling values of the detected voltages and currents by a time domain lumped parameter differential equation for the transmission line; recording the computed three instantaneous voltage values; computing the fault component values or sudden-change values of the calculated instantaneous voltages at the preset compensated point; detecting the faulted phases by comparing the fault component instantaneous voltages; and generating signals indicating the faulted phases.

According to another aspect of present invention, it provides a control system for detecting faulted phase of transmission line in an AC power system, including: a sampling circuit, for sampling voltage and current signals at one end of the transmission line at a series of time points; a controller, for computing instantaneous voltage values at a preset compensated point on transmission line based on the sampling values of the detected voltages and currents by a time domain lumped parameter differential equation for the transmission line; and a storage circuit, for recording the computed instantaneous voltage and current values; wherein: the controller is further adapted for computing fault component instantaneous voltage values of the calculated voltages at the preset compensated point, detecting the faulted phases by comparing the fault component instantaneous voltages, and generating signals indicating the faulted phases.

According to another aspect of present invention, it provides a protective relay using the control system for detecting faulted phases of transmission line in an AC power system.

The fault component of the instantaneous voltage values in the phase-phase/phase-ground loops at the compensated point may thus be used for detecting the faulted phases from the fault type group comprising types of single phase fault, phase-phase fault, two phases to ground fault, and three phase fault, which are computed in consideration of the magnitudes of sampling electric signals of the three phases at one end of the transmission line at a series of time points. The time domain lumped parameter differential equation can achieve better performance at a relatively low sampling rate, for example 1 kHz to 4 kHz, compared with the method based on travelling wave transmitting formula.

Preferably, the electric signals are instantaneous voltages of phase-phase loop for the detection of faulted phases from the fault type group in consideration of arithmetic relationship among the changes of the instantaneous voltage values for the three phase-phase loop electrical signals. In particular, the fault type group comprises types of single phase fault, phase-phase fault, two phases to ground fault, and three phase fault.

Preferably, the method for detecting faulted phases of transmission line in an AC power system may further include: computing three single-phase instantaneous voltage values of single-phase loop electric signals at a preset compensated point on the transmission line from the values of the sampled electric signals based on a time domain lumped parameter differential equation for the transmission line for the series of time points; recording the computed three single-phase instantaneous voltage values of the single-phase loop electric signals; computing the fault component or sudden-change instantaneous voltages at the preset compensated point; detecting the faulted phases or fault types by comparing the calculated single-phase loop and phase-phase loop fault component voltages at the preset compensated point; and generating signals indicating the faulted phases.

Correspondingly, in the control system for detecting faulted phases of transmission line in an AC power system, the controller is further adapted for computing three single-phase instantaneous voltage values of single-phase loop electric signals at a compensated point on the transmission line from the values of the sampled electric signals based on a time domain lumped parameter differential equation for the transmission line for the series of time points; the storage circuit is further adapted for recording the computed three single-phase instantaneous voltage values of the single-phase loop electric signals; the controller is further adapted for computing fault component or sudden-change instantaneous voltages of each of the single-phase loop electrical signals, detecting the faulted phases by comparing the calculated single-phase loop and phase-phase loop fault component voltages at the preset compensated point, and generating signals indicating the faulted phases.

Preferably, the electric signals are instantaneous voltages of single-phase loop for the identification of the faulty phase in consideration of arithmetic relationship among the changes of the single-phase instantaneous voltage values concerning the single-phase loop electric signals.

Preferably, the second time point is current time point and the first time point occurs before occurrence of the second time point by at least one period of the AC power system fundamental frequency cycle.

Preferably, the time domain lumped parameter differential equation is based on Resistor-Inductor-Capacitor (RLC) model or Resistor-Inductor (RL) model for the transmission lines.

BRIEF DESCRIPTION OF THE DRAWINGS

The subject matter of the invention will be explained in more detail in the following text with reference to preferred exemplary embodiments which are illustrated in the drawings, in which.

PREFERRED EMBODIMENTS OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods and programming procedures, devices, and circuits are omitted so not to obscure the description of the present invention with unnecessary detail.

Figure 1:
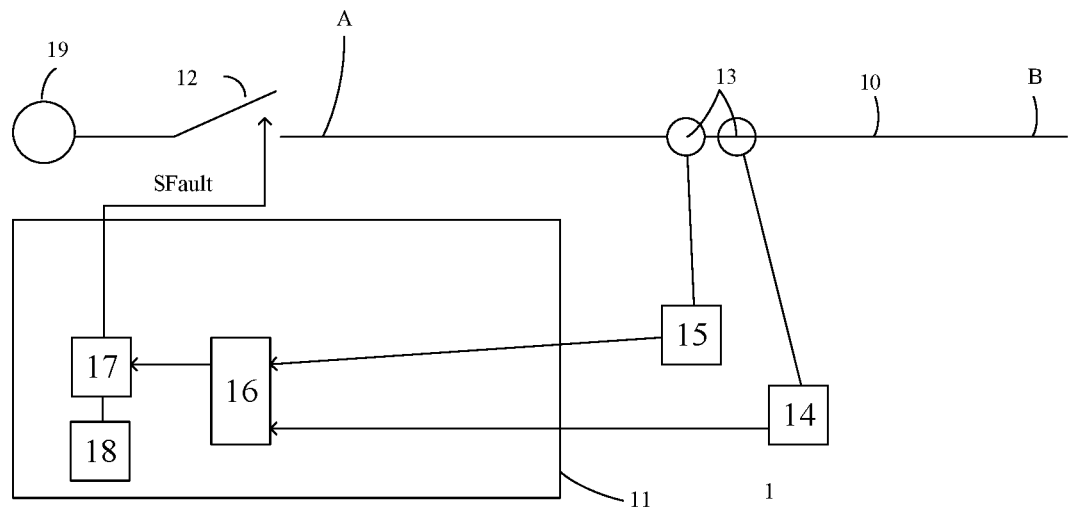
FIG. 1 shows an AC power system according to an embodiment of present invention.

FIG. 1 shows an AC power system according to an embodiment of present invention. As shown in FIG. 1, the AC power system 1 includes a transmission line 10 defined at its two ends A and B. A protective relay 11, in the event of a fault, may disconnect the affected phase of the transmission line 10, for example by its power circuit breaker 12. An AC source 19 is provided to be connected to the power circuit breaker 12 which further connects with the end A of the transmission line 10. Protective relay 11 is provided for this purpose at one of the line ends A and B at measurement points 13. Electric signals, such as current and voltage signals, appear at the measurement point 13 is transformed by current transformer 14 and voltage transformer 15 and are fed to the protective relay 11 and sampled by its sampling circuit 16.

The protective relay 11 samples the current and voltage signals by sampling circuits 16 of an A/D conversion at a series of time points, and performs a fault type identification, by its controller 17, for the current and voltage sampled values thus generated so as to be able to detect fault and its type of the transmission line 10. In the event of such a fault, it may be single phase fault of short circuit between a phase and the ground, phase-phase fault of short circuit between any two phases, two phases to ground fault of short circuit between either of two phases and the ground, and three phase fault of short circuits among three phases. If the protective relay 11 identifies a fault and its type, for example by its controller 17, a fault signal S fault indicating the identified fault type is thus generated by the controller 17 which is used to initiate tripping signal to the power circuit breaker 12 so as to allow said power circuit breaker to open its switching contacts and to disconnect the phase affected by the short circuit from the rest of the energy supply network. A storage circuit 18 is connected to the controller 17 for storing date.

The fault detection method explained hereinafter is used for fault evaluation of the current and voltage sampled values or what are known as change values, which are established by the principle of time domain lumped parameter differential equation for the transmission line, which will therefore first be explained briefly hereinafter. The time domain lumped parameter model may be for example an RLC model or an RL model. RLC model is used for an example illustrating the present invention hereinafter.

The RLC model is one of the lumped parameter model and it is an example equivalent model used for the electrical line in the present invention. The RLC model comprises a resistor, an inductor and a capacitor. In other words, the whole transmission line can be represented by an equivalent circuit containing a resistor, an inductor and a capacitor. For illustrative purposes, reference is made to FIG. 2 to describe an example RLC model for a transmission line system.

Figure 2:
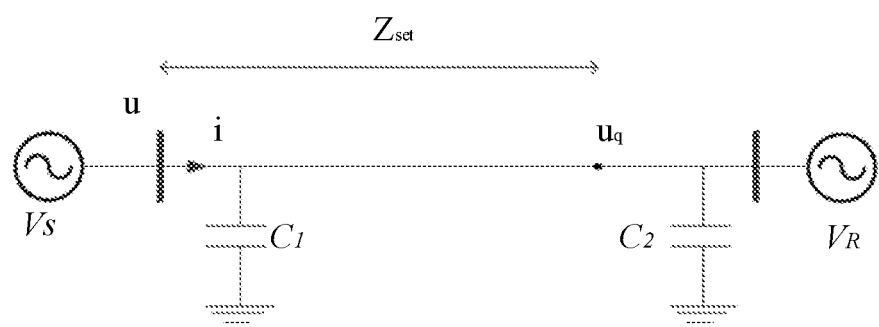
FIG. 2 shows an example RLC model for a transmission line system.
Figure 3:
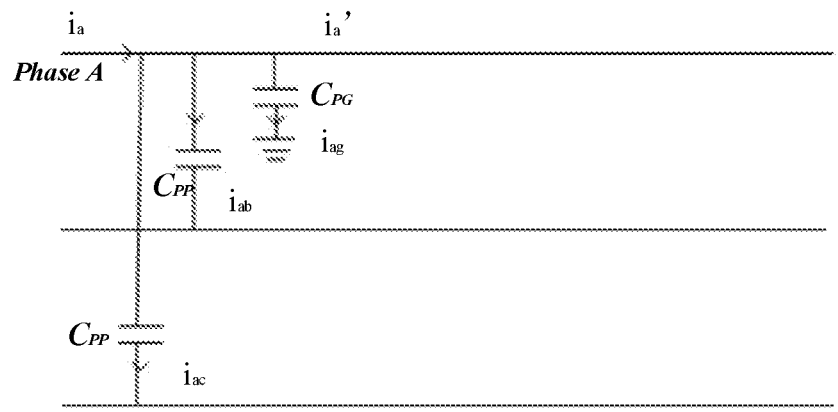
FIG. 3 schematically illustrates of a diagram of a capacitive current path for phase A according to an embodiment of the present invention.

As illustrated in FIG. 2, the RLC model is a standard PI-type line model. The voltage at the start point is denoted by Vs and the voltage at the end point is denoted by $V_R$; the voltage and current at the measurement point are denoted by u and i respectively, the voltage at a setting point is denoted by $u_q$. The transmission line between the start point and the end point can be equivalent to a resistor and an inductor connected in series and two capacitors $C_1$ and $C_2$ which are respectively connected to the start point and the end point of the transmission line. The impedance of the protection zone can be denoted by $Z_{set}$ in fundamental frequency domain $$Z_{set} = R + jX \tag{1}$$

Where $Z_{set}$ denotes the impedance of the protection zone, R denotes the resistance of the equivalent resistor of the transmission line and X denotes the inductance of the equivalent inductor of the transmission line. It shall be understood that although FIG. 2 illustrates the RLC model as a PI-type RLC model, the present invention is not limited thereto. The RLC model can also be any other forms of RLC model, a T-type RLC model, Tau-type RLC model, or some modified versions thereof. In addition, it may also use a further simplified RL model for the transmission line system. In some embodiments of the present invention, it can erase a capacitive current in a phase current. That is to say, after a phase current is obtained, at least one of a capacitive current to the ground and a capacitive current between phases can be removed from the obtained phase current. For illustration purposes, FIG. 3 schematically illustrates of a diagram of a capacitive current path for phase A according to an embodiment of the present invention. As illustrated in FIG. 3, for phase A, there is a capacitance $C_{PG}$ of the line for phase A to the ground, a first capacitance $C_{PP}$ between the line for phase A and the line for phase B, and a second capacitance $C_{PP}$ between the line for phase A and the line for phase C. The capacitive currents related to capacitances $C_{PG}$, the first $C_{PP}$ and the second $C_{PP}$ are denoted by $i_{ag}$, $i_{ab}$, $i_{ac}$, respectively. The currents $i_{ag}$, $i_{ab}$, $i_{ac}$ can be obtained by following equations:

$$i_{ag} = C_{PG} \times \frac{du_a}{dt} \tag{2}$$

$$i_{ab} = C_{PP} \times \frac{du_{ab}}{dt} \tag{3}$$

$$i_{ac} = C_{PP} \times \frac{du_{ac}}{dt} \tag{4}$$

wherein $u_a$ represents the phase voltage of phase A; $u_{ab}$ represents a voltage difference between the phase voltage $u_a$ and a phase voltage $u_b$ i.e., $u_{ab} = u_a - u_b$; $u_{ac}$ represents a voltage difference between the phase voltage $u_a$ and a phase voltage $u_c$, i.e., $u_{ac} = u_a - u_c$. Thus, the current $i_a'$, which represents a current of phase A by removing the capacitive current impact can be determined based on the following equations.

$$i_a' = i_a - \left( C_{PG} \times \frac{du_a}{dt} + C_{PP} \times \frac{du_{ab}}{dt} + C_{PP} \times \frac{du_{ac}}{dt} \right) \tag{5}$$

Similarly, currents $i_b'$, $i_c'$ can represent phase currents by removing the capacitive current impact for phase B and phase C, respectively, and they can be determined as follows:

$$i_b' = i_b - \left( C_{PG} \times \frac{du_b}{dt} + C_{PP} \times \frac{du_{ba}}{dt} + C_{PP} \times \frac{du_{bc}}{dt} \right) \tag{6}$$

$$i_c' = i_c - \left( C_{PG} \times \frac{du_c}{dt} + C_{PP} \times \frac{du_{ca}}{dt} + C_{PP} \times \frac{du_{cb}}{dt} \right) \tag{7}$$

wherein $u_b$ represents the voltage of phase B; $u_c$ represents the voltage of phase C; $u_{ba}$ represents the voltage difference between the phase voltage $u_b$ and the phase voltage $u_a$, i.e., $u_{ba} = u_b - u_a$; $u_{ca}$ represents the voltage difference between the phase voltage $u_c$ and the phase voltage $u_a$, i.e., $u_{ca} = u_c - u_a$; $u_{bc}$ represents the voltage difference between the phase voltage $u_b$ and the phase voltage $u_c$, i.e., $u_{bc} = u_b - u_c$; $u_{cb}$ represents the voltage difference between the phase voltage $u_c$ and the phase voltage $u_b$, i.e., $u_{cb} = u_c - u_b$.

Figure 4:
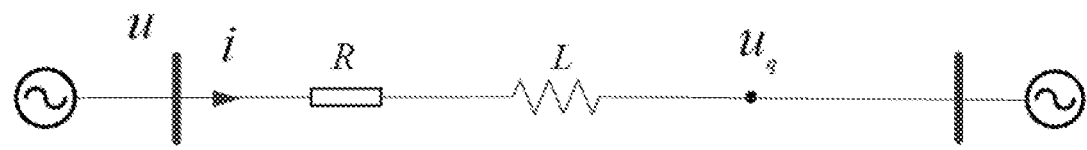
FIG. 4 schematically illustrates a single line diagram for the transmission line according to an embodiment of the present invention.

Thus, in embodiments of the present invention, it may use the current $i_a'$, $i_b'$, $i_c'$, which have subtracted the capacitive currents, instead of the original sampled currents $i_a$, $i_b$, $i_c$. If the capacitive currents are erased from the phase current, then the model of the transmission can be further reduced. For illustration purposes, FIG. 4 schematically illustrates a single line diagram for the transmission line according to an embodiment of the present invention. FIG. 4 is similar to that model as illustrated in FIG. 2, but resistor R and inductor L are illustrated in details and capacitors connected at the start point and the end point are removed since the capacitive currents are removed from the phase current.

Based on the single line diagram as illustrated in FIG. 4, the voltage at the setting point $u_q$ can be determined based on a differential equation such as:

$$u_q(t) = u(t) - R * i(t) - L * \frac{di(t)}{dt} \tag{8}$$

wherein u(t) represents the voltage at the measurement point; i(t) represents the current at the measurement point, R represents a resistance value of a resistor in the lumped parameter model, and L represents an inductance value of an inductor in the lumped parameter model and di(t)/dt represents the differential value of the current i(t). If we consider the discrete time system domain, for example a sample point at time instant k, the following equation (8') can be used to represent the calculation in equation (8).

$$u_{q\_k} = u_k - \left( R \cdot i_k + L \cdot \frac{di_k}{dt} \right) \tag{8'}$$

wherein $u_{q\_k}$ represents the voltage at the setting point; $u_k$ represent the voltage at the measurement point; $i_k$ represents the current at the measurement point and L represents the inductance of inductor in the lumped parameter model (for example the RLC model); R represents the resistance of a resistor in the lumped parameter model (for example the RLC model); $di_k/dt$ represents the differential value of the current $i_k$ ($di_k=i_k-i_{k-1}$; $dt$=a sample interval for the given sampling rate; $i_{k-1}$ means the measured current at the time instant k-1 which is previous of time instant k in the discrete time domain)

Figure 5:
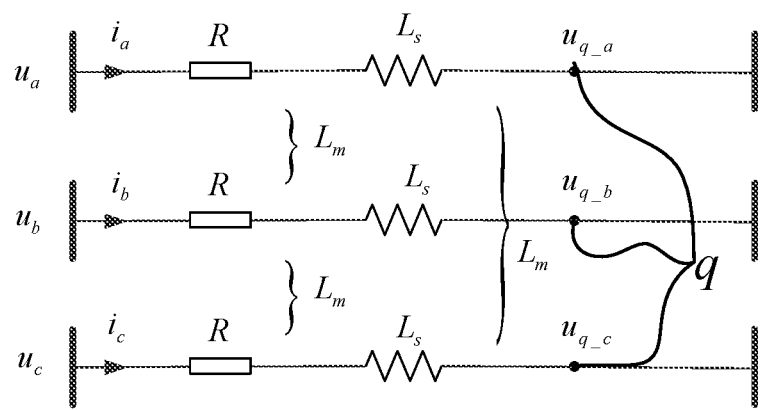
FIG. 5 shows three-phase transmission line diagram.

FIG. 5 shows three-phase transmission line diagram. As shown in FIG. 5, $L_s$ is the phase inductance, $L_m$ is the mutual inductance between phases, and k is the sampling time point. With the three-line diagram, it may determine voltages $u_{q\_a\_k}$, $u_{q\_c\_k}$ and $u_{q\_c\_k}$ based on equation (8) by further taking mutual inductance between phases into consideration. For example, voltage $u_{q\_a\_k}$, $u_{q\_b\_k}$ and $u_{q\_c\_k}$ can be determined based on the differential equation such as:

$$\begin{cases} u_{q\_a\_k} = u_{a\_k} - \left[ R \cdot i_{a\_k} + L_s \cdot \frac{di_{a\_k}}{dt} + L_m \cdot \frac{di_{b\_k}}{dt} + L_m \cdot \frac{di_{c\_k}}{dt} \right] \\ u_{q\_b\_k} = u_{b\_k} - \left[ R \cdot i_{b\_k} + L_s \cdot \frac{di_{b\_k}}{dt} + L_m \cdot \frac{di_{a\_k}}{dt} + L_m \cdot \frac{di_{c\_k}}{dt} \right] \\ u_{q\_c\_k} = u_{c\_k} - \left[ R \cdot i_{c\_k} + L_s \cdot \frac{di_{c\_k}}{dt} + L_m \cdot \frac{di_{a\_k}}{dt} + L_m \cdot \frac{di_{b\_k}}{dt} \right] \end{cases} \quad (9)$$

wherein $u_{a\_k}$, $u_{b\_k}$ and $u_{c\_k}$ respectively represents line voltages for phase A, phase B and phase C at the measurement point; $u_{a\_k}$, $u_{b\_k}$ and $u_{c\_k}$ respectively represents currents for phase A, phase B and phase C at the measurement point; $L_s$ represents the phase inductance for phase A, phase B and phase C; and $L_m$ represents the inductance between phases for phase A, phase B and phase C. Since the phase to phase voltage is a voltage difference between one phase and another phase, thus the phase-to-phase voltages $u_{q\_ab\_k}$, $u_{q\_bc\_k}$ and $u_{q\_ca\_k}$ can be further determined based on the phase voltages $u_{q\_a\_k}$, $u_{q\_b\_k}$ and $u_{q\_c\_k}$ determined based on equation (9). For example, the voltage $u_{q\_ab\_k}$, i.e. the voltage between phase A and B at the setting point, can determined by:

$$\begin{aligned} u_{q\_ab\_k} &= u_{q\_a\_k} - u_{q\_b\_k} \\ &= u_{ab\_k} - \left[ R \cdot i_{ab\_k} + (L_s - L_m) \cdot \frac{di_{ab\_k}}{dt} \right] \\ &= u_{ab\_k} - \left[ R \cdot i_{ab\_k} + L \cdot \frac{di_{ab\_k}}{dt} \right] \end{aligned} \quad (10)$$

wherein $u_{ab\_k}$, $i_{ab\_k}$ respectively represent the voltage and current between phase A and phase B at the measurement point; R and L mean a positive sequence resistance and inductance for the phase line, L equals to the difference of Ls and Lm, i.e., $L=L_s-L_m$.

In equation (10), R and L are positive sequence resistance and inductance, $L=L_s-L_m$. Similarly, the voltages $u_{q\_bc\_k}$ and $u_{q\_ca\_k}$ can be computed too. According to the differential equation (10), the phase-to-phase voltages $u_{q\_ab\_k}$, $u_{q\_bc\_k}$ and $u_{q\_ca\_k}$ can be determined by the differential equation (11).

Equation (11) summarized the computation for these three phase-to-phase loop voltages, R and L in Equation (11) are positive sequence resistance and inductance:

$$\begin{cases} u_{q\_ab\_k} = u_{ab\_k} - \left( R \cdot i_{ab\_k} + L \cdot \frac{di_{ab\_k}}{dt} \right) \\ u_{q\_bc\_k} = u_{bc\_k} - \left( R \cdot i_{bc\_k} + L \cdot \frac{di_{bc\_k}}{dt} \right) \\ u_{q\_ca\_k} = u_{ca\_k} - \left( R \cdot i_{ca\_k} + L \cdot \frac{di_{ca\_k}}{dt} \right) \end{cases} \quad (11)$$

wherein $u_{ab\_k}$, $i_{ab\_k}$ respectively represents the voltage and current between phase A and phase B at the measurement point; $u_{bc\_k}$, $i_{bc\_k}$ respectively represent the voltage and current between phase B and phase C at the measurement point; $u_{ca\_k}$, $i_{ca\_k}$ respectively represent the voltage and current between phase C and phase A at the measurement point; R and L mean the positive sequence resistance and inductance for the phase line, L equals to the difference of Ls and Lm, i.e., $L=L_s-L_m$.

Thus, we can determine the phase voltage $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$. It shall be understood that although the phase voltages $u_{q\_a\_k}$, $u_{q\_b\_k}$ and $u_{q\_c\_k}$ and the phase-to-phase voltages $u_{q\_ab\_k}$, $u_{u\_bc\_k}$ and $u_{q\_ca\_k}$ are described as to be determined based on equation (9) and (11) respectively, the present invention is not limited to these embodiments. In fact, it is possible to use any suitable form of differential equations.

For the phase-ground loop, voltages $u_{q\_a\_k}$, $u_{u\_b\_k}$ and $u_{q\_c}$ at the compensation point q are computed by equation (9). Furthermore, these three voltages at the compensation point q can be computed by equation (12), R and L in Equation (12) are positive sequence resistance and inductance, the deduction process is not described here for the simplicity and clarity.

$$\begin{cases} u_{q\_a\_k} = u_{a\_k} - \left[ R \cdot (i_{a\_k} + k_R \cdot 3i_{0\_k}) + L \cdot \frac{d(i_{a\_k} + k_L \cdot 3i_{0\_k})}{dt} \right] \\ u_{q\_b\_k} = u_{b\_k} - \left[ R \cdot (i_{b\_k} + k_R \cdot 3i_{0\_k}) + L \cdot \frac{d(i_{b\_k} + k_L \cdot 3i_{0\_k})}{dt} \right] \\ u_{q\_c\_k} = u_{c\_k} - \left[ R \cdot (i_{c\_k} + k_R \cdot 3i_{0\_k}) + L \cdot \frac{d(i_{c\_k} + k_L \cdot 3i_{0\_k})}{dt} \right] \\ k_R = \frac{R_0 - R_1}{3R_1} \quad k_L = \frac{L_0 - L_1}{3L_1} \end{cases} \quad (12)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$, represents zero sequence current at instant k; $K_R$ represents a factor determined based on $R_0$, $R_1$ as indicated in equation (12); $K_L$ represents a factor determined based on $L_0$, $L_1$ as indicated in equation (12).

Based on the principle of time domain lumped parameter differential equation for the transmission line, three instantaneous voltage values $u_{q\_ab\_k}$, $u_{q\_bc\_k}$ and $u_{q\_ca\_k}$ of phase-phase loop electric signals at compensated point q on the three phases of the transmission line can be computed from the values of the sampled electric signals. Namely, a mathematical link can be established by the equations between the values of the sampled electric signals measured at the measurement point 13 and the three instantaneous voltage values $u_{q\_ab\_k}$, $u_{q\_bc\_k}$ and $u_{q\_ca\_k}$ of phase-phase loop electric signals at compensated point q on the three phases of the transmission.

Below are described embodiments of fault identification based on the principle of time domain lumped parameter differential equation described accompany with FIGS. 6 to 15. The current transformer 14 and the voltage transformer 15 as shown in FIG. 1 perform sampling of the currents and the voltages at the measurement point 13. As shown in FIGS. 6 to 15, for example, their sampling rate may set at 1 KHz, and the samples of the currents and voltages are detected at the series of time points (sampling instants) with time interval of 1 ms. A time window may be set shifting along the time axis, which is defined by two of the series of time points. The width of the time window may be is set at an integral number of the AC power system fundamental frequency cycle, for example 20 ms, 40 ms, 60 ms, and so on. Supposing that a fault occurs at t0 (300 ms), and the time window having a width of 20 ms successively starts at each of the series of time points starting at 0 ms, the skilled person shall understand that with the moving of the time window, there will be one which covers the fault-occurring time point t0 for the first time, for example the one starts at a first time point t1 (281 ms) and ends at a second time point (301 ms).

Single Phase Fault Identification

Figure 6:
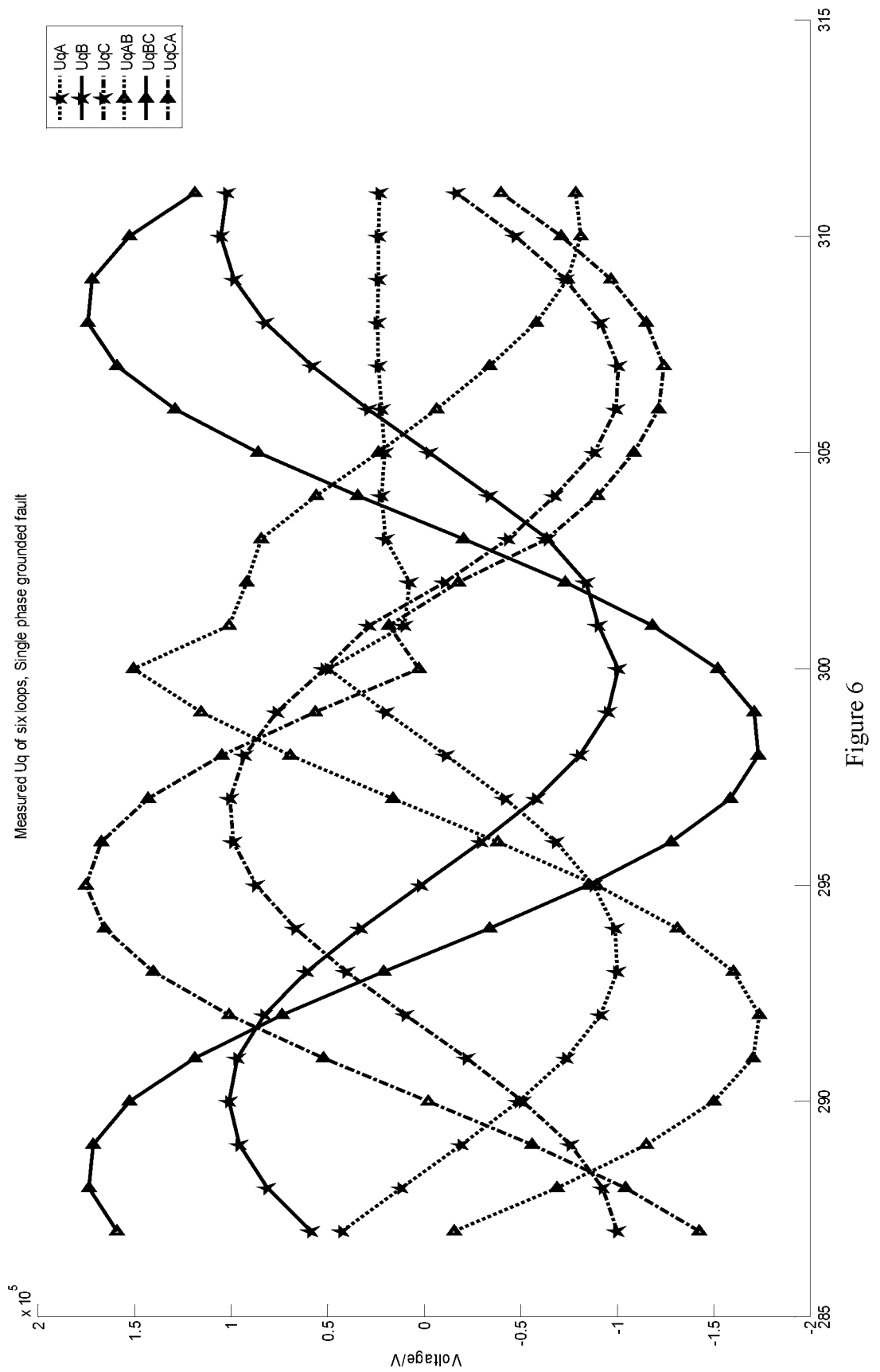
FIG. 6 shows the three instantaneous voltage values of phase-phase loop electric signals at the compensation point q in the condition of faulty phase A.
Figure 7:
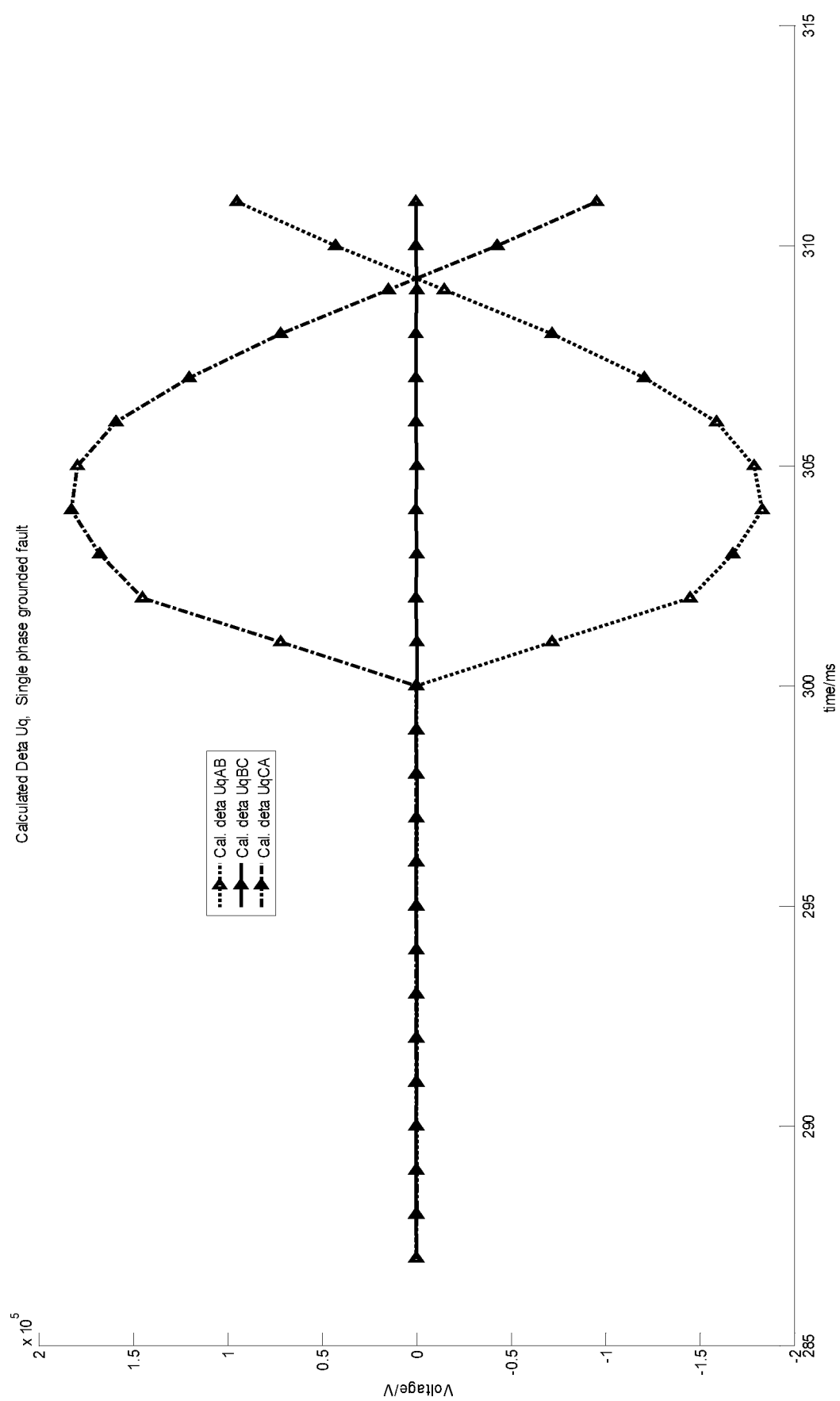
FIG. 7 shows a computed fault component or sudden-change of the instantaneous voltage value of each of the phase-phase loop electrical signals at the compensation point q.

FIG. 6 shows the three instantaneous voltage values of phase-phase loop electric signals and three instantaneous voltage values of phase-ground loop electric signals at the compensation point q in the condition of faulty phase A. FIG. 7 shows a computed fault component or sudden-change of the instantaneous voltage value of each of the phase-phase loop electrical signals at the compensation point q in the condition of faulty phase A. In this case where the single phase fault of phase A is described as an example as shown in FIGS. 3 and 4 for purpose of simplicity and clarity. It should be understood that the following description also applies with respect to single phase fault occurring to phases B and C.

As shown in FIG. 6, the diagram UqA shows the temporal curve of the actual voltage of phase A at the compensation point q $U_{qa}$ before and after the occurrence of the short circuit at t0 (300 ms). The diagrams UqB and UqC respectively show the temporal curves of the actual voltages of phase B and phase C at the compensation point q, $U_{qb}$ and $U_{qc}$, where no fault has occurred. The diagrams UqAB, UqBC, UqCA respectively show the temporal curves of the actual voltage values of phase-phase loop involving phases A and B, phases B and C, and phases C and A, $U_{qab}$, $U_{qbc}$ and $u_{qca}$. As shown in FIG. 6, it can be seen that the voltages magnitude of phase A to phase B and phase C to phase A $U_{qab}$ $U_{qca}$ change suddenly with the start of the short circuit at a time point t0 (300 ms) and then progresses with deviation from it should have been without the occurrence of the fault.

As shown in FIG. 7, diagrams deta UqAB, deta UqBC and deta UqCA respectively relate to the computed fault component or sudden-change of the instantaneous voltage value of each of the phase-phase loop electrical signals $\Delta U_{qab}$, $\Delta U_{qbc}$ and $\Delta U_{qca}$ at the compensation point q. The respective change quantities can therefore be computed by establishing the difference between the discrete values for pre-fault and after-fault voltages UqAB, UqBC, UqCA as below $$\begin{cases} \Delta U_{qab} = U_{q\_ab\_k} - U_{q\_ab\_k-n} \\ \Delta U_{qbc} = U_{q\_bc\_k} - U_{q\_bc\_k-n} \\ \Delta U_{qca} = U_{q\_ca\_k} - U_{q\_ca\_k-n} \end{cases} \quad (13)$$

wherein, k-n indicates the k-nth sampling instant, k indicates the kth sampling instant, and k-n precedes k by at least one the AC power system fundamental frequency cycle T, for example 20 ms.

As described, the computed three instantaneous voltage values of phase-phase loop electric signals $U_{q\_ab\_k-n}$, $U_{q\_ab\_k}$, $U_{q\_bc\_k-n}$, $U_{q\_bc\_k}$ and $U_{q\_ca\_k-n}$, $U_{q\_ca\_k}$ can be computed based on the principle of a time domain lumped parameter differential equation for the transmission line and consequently the pre-fault value $u_{q\_ab\_k-n}$, $U_{q\_bc\_k-n}$ and $U_{q\_ca\_k-n}$ have to be stored in a storage circuit 18 performing the fault evaluation for the duration of at least one full fundamental frequency cycle T so as to be able to retrieve it when computing the voltage change $\Delta U_{qab}$, $\Delta U_{qbc}$ and $\Delta U_{qca}$. For example, the storage circuit 18 can be memory.

Due to the characteristics of single phase fault with phase A, it can also be obtained that $\Delta U_{qab} = \Delta U_{qca}$ so that the discrete values for $\Delta U_{qab}$ and $\Delta U_{qca}$ are similar to each other, while $\Delta U_{qbc}$ keeps zero because this loop has nothing to do with the fault.

Consequently, the fault feature of single phase fault with phase A can be expressed as below:

$$\begin{cases} \Delta U_{qab} = \Delta U_{qca} \\ \Delta U_{qbc} = 0 \end{cases} \quad (14)$$

Due to similar reasons, the expressions as below are true for single phase fault with phase B or phase C:

$$\begin{cases} \Delta U_{qab} = \Delta U_{qbc} \\ \Delta U_{qac} = 0 \end{cases} \quad (15)$$

$$\begin{cases} \Delta U_{qbc} = \Delta U_{qca} \\ \Delta U_{qab} = 0 \end{cases} \quad (16)$$

By sorting sort $\Delta U_{qab}$, $\Delta U_{qbc}$ and $\Delta U_{qca}$ by the amplitude to (M1, M2, M3), a single phase fault can be identified, whatever the faulty phase is, by:

$$\begin{cases} M1 = M2 \\ M3 = 0 \end{cases} \quad (17)$$

Based on equation (17), a single phase fault can be identified, for example by the controller 17, from a fault type group in consideration of the changes of the instantaneous voltage values for the three phase-phase loop electrical signals $\Delta U_{qab}$, $\Delta U_{qbc}$ and $\Delta U_{qca}$, and a first fault signal can be thus generated indicating the identified fault type, a single-phase fault, from a fault type group including: single phase fault, phase-phase fault, two phases to ground fault, and three phase fault.

Phase-Phase Fault Identification

Figure 8:
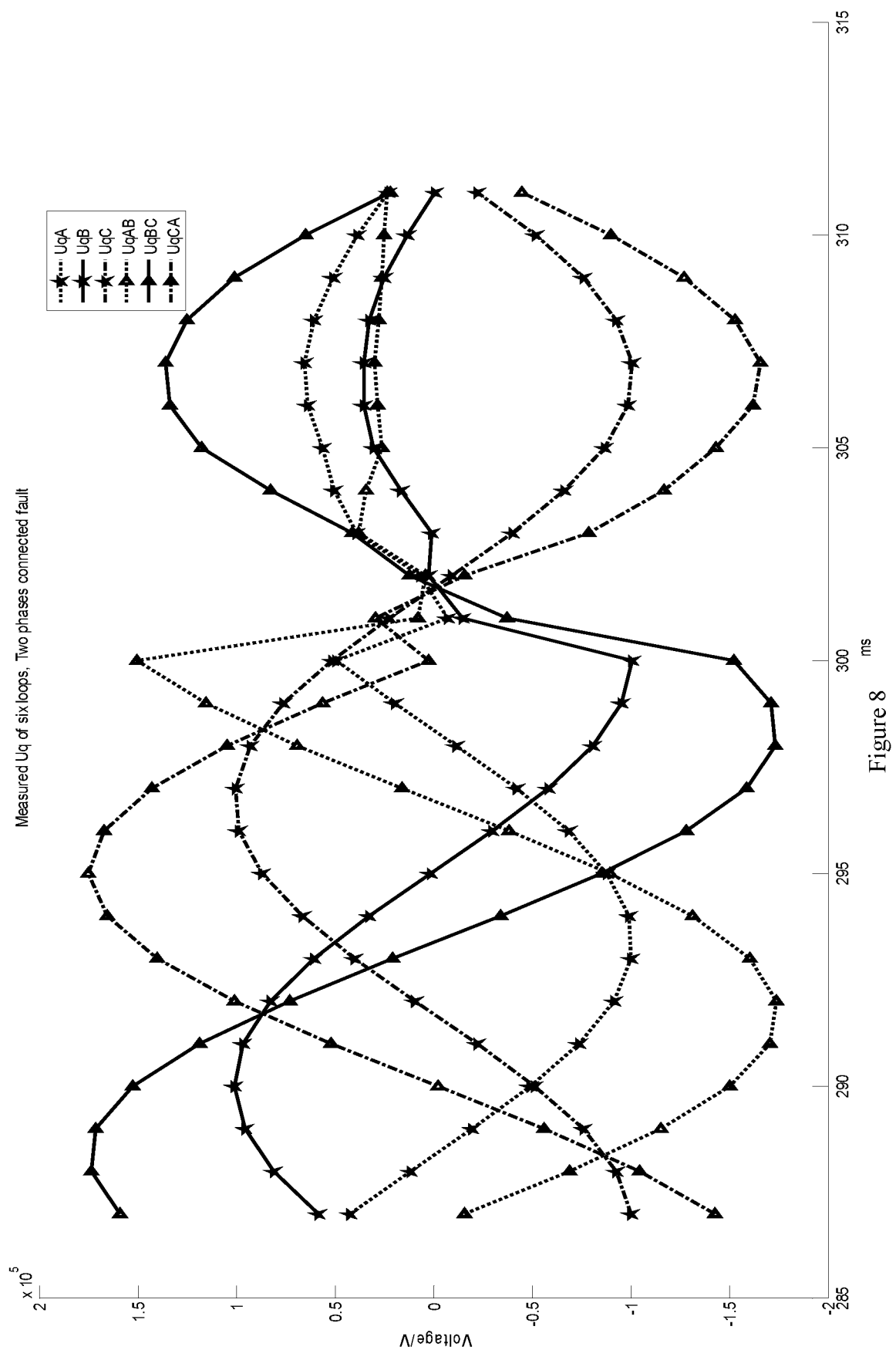
FIG. 8 shows the three instantaneous voltage values of phase-phase loop electric signals at the compensation point q in the condition of single phase-phase fault involving phases A and B.
Figure 9:
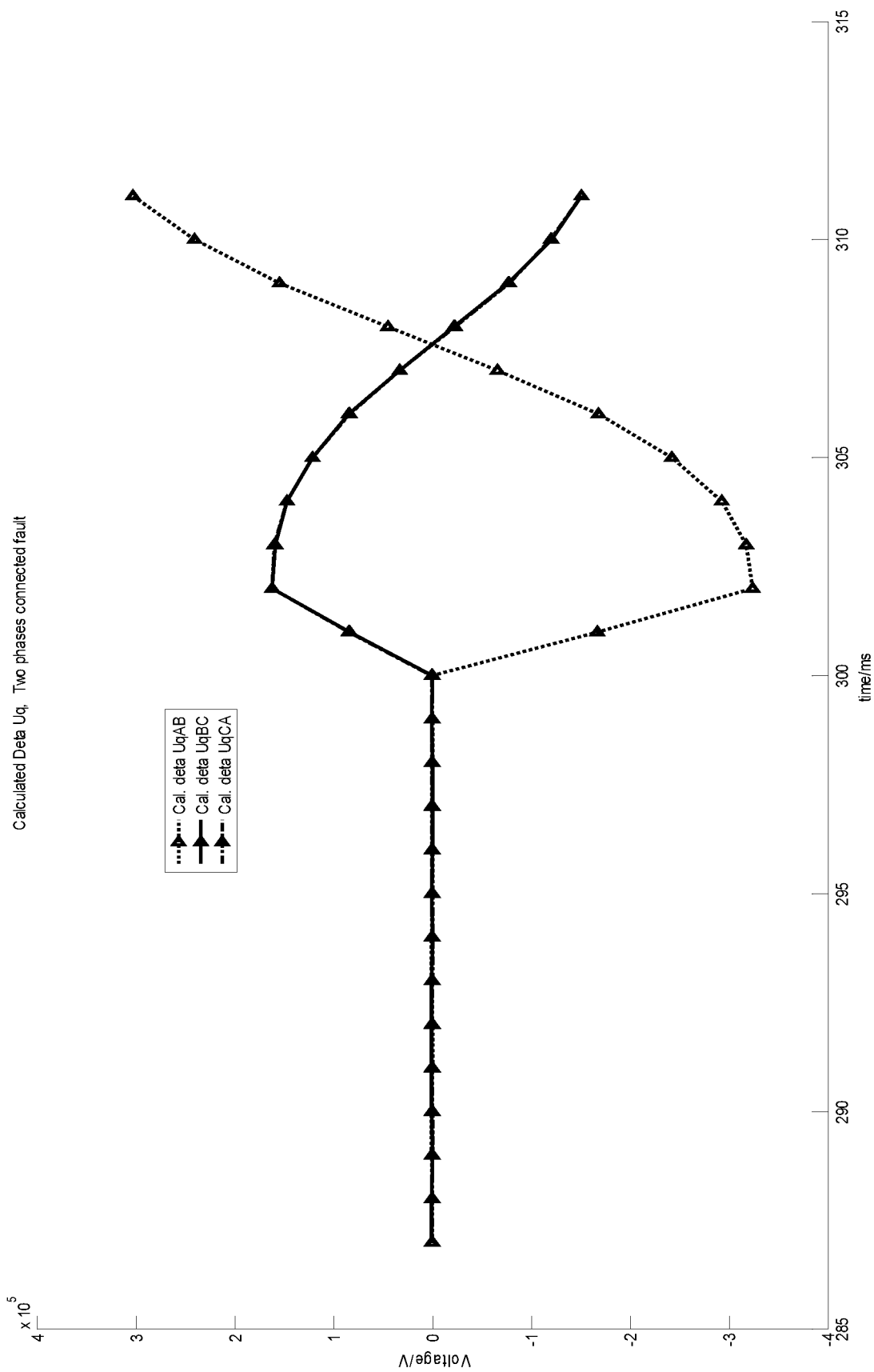
FIG. 9 shows a computed fault component or sudden-change of the instantaneous voltage value of each of the phase-phase loop electrical signals at the compensation point q in the condition of the phase-phase fault.

FIG. 8 shows the three instantaneous voltage values of phase-phase loop electric signals and three instantaneous voltage values of phase-ground loop electric signals at the compensation point q in the condition of single phase-phase fault involving phases A and B. FIG. 9 shows a computed fault component or sudden-change of the instantaneous voltage value of each of the phase-phase loop electrical signals at the compensation point q in the condition of the phase-phase fault. In this case where the phase-phase fault between phases A and B is described as an example. It should be understood that the following description also applies with respect to phase-phase fault occurring to phases B and C/phases C and A.

As shown in FIG. 8, the diagrams UqA and UqB show the temporal curves of the actual voltages of phases A and B at the compensation point q $U_{qa}$ $U_{qb}$ before and after the occurrence of the short circuit at t0 (300 ms). The diagram UqC shows the temporal curves of the actual voltage of phase C at the compensation point q, $U_{qc}$, where no fault has occurred. The diagrams UqAB, UqBC, UqCA respectively show the temporal curves of the actual voltage values of phase-phase loop involving phases A and B, phases B and C, and phases C and A, $U_{qab}$, $U_{qbc}$ and $U_{qca}$. As shown in FIG. 8, it can be seen that the voltage magnitude of phase A to phase B $U_{qab}$ changes suddenly with the start of the short circuit at t0 and then progresses with deviation from it should have been without the occurrence of the fault; the magnitudes of phase-phase voltages $U_{qbc}$ and $U_{qca}$ also change suddenly with the start of the short circuit at t0 (300 ms).

As shown in FIG. 9, diagrams deta UqAB, deta UqBC and deta UqCA respectively relate to the computed fault component or sudden-change of the instantaneous voltage value of each of the phase-phase loop electrical signals $\Delta U_{qab}$, $\Delta U_{qbc}$ and $\Delta U_{qca}$ at the compensation point q. The respective change quantities can therefore be computed by establishing the difference between the discrete values for pre-fault and after-fault voltages UqAB, UqBC, UqCA according to equation (13).

In addition, the pre-fault phase-phase voltages $U_{q\_ab\_k-n}$, $U_{g\_bc\_k-n}$, $U_{q\_ca\_k-n}$ have to be stored in a storage circuit 18 performing the fault evaluation for the duration of at least one full fundamental frequency cycle T so as to be able to compute the curve of the fault component or sudden-change of phase-phase voltages.

Due to the characteristics of single phase-phase fault with phases A and B, it can also be obtained that:

$$\begin{cases} \Delta U_{qbc} = \Delta U_{qca} \\ \Delta U_{qab} = 2\Delta U_{qbc} = 2\Delta U_{qca} \end{cases} \quad (18)$$

By sorting sort $\Delta U_{qab}$, $\Delta U_{qbc}$ and $\Delta U_{qca}$ by the amplitude to (M1, M2, M3), a single phase-phase fault can be identified, whatever the faulty phases are, by:

$$M1 = 2M2 = 2M3 \quad (19)$$

Based on equation (19), a single phase-phase fault can be identified, for example by the controller 17, from a fault type group in consideration of the changes of the instantaneous voltage values for the three phase-phase loop electrical signals $\Delta U_{qab}$, $\Delta U_{qbc}$ and $\Delta U_{qca}$, and a first fault signal can be thus generated indicating the identified fault type, a single phase-phase fault, from a fault type group including: single phase fault, phase-phase fault, two phases to ground fault, and three phase fault.

Two Phases to Ground Fault Identification

Figure 10:
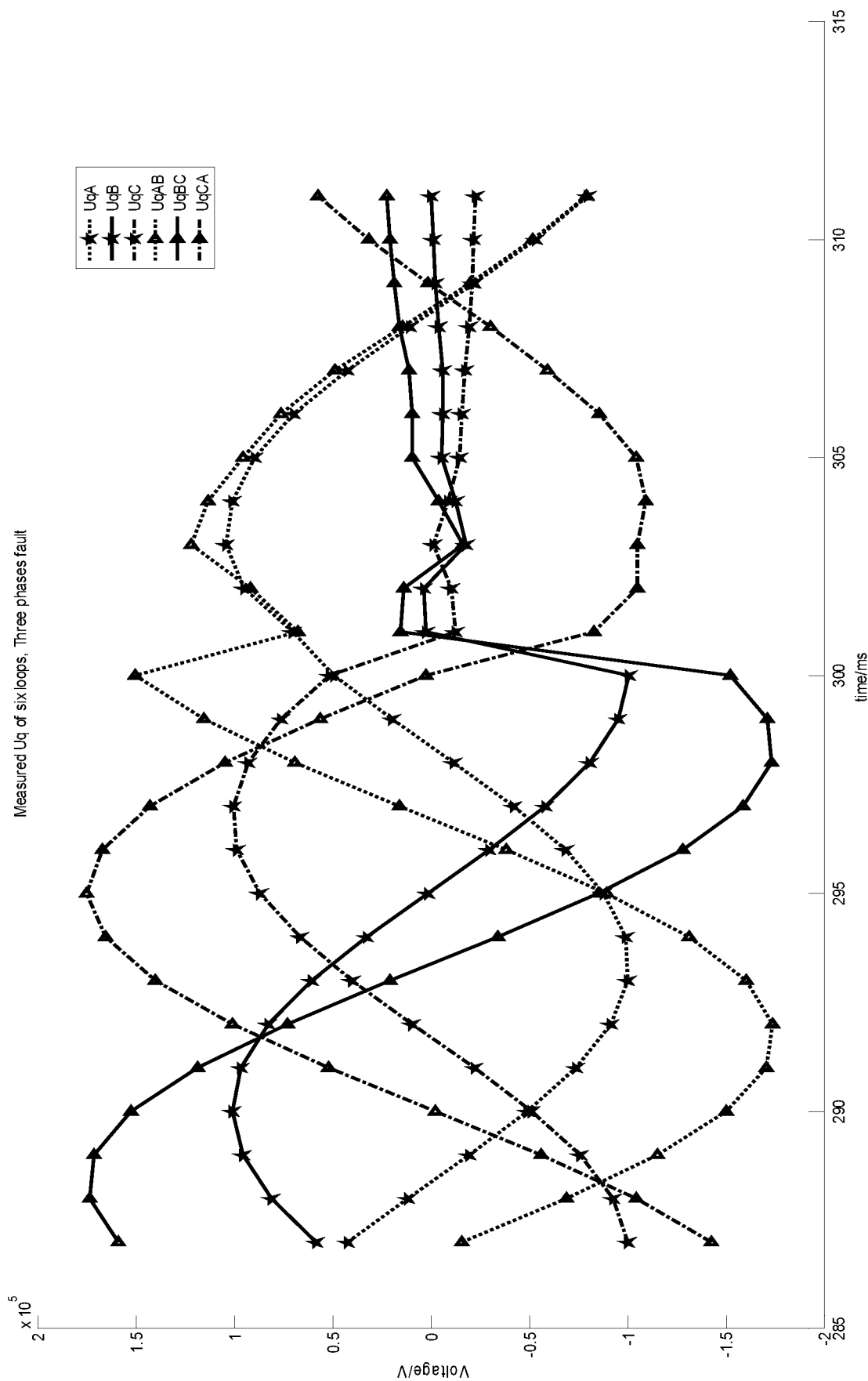
FIG. 10 shows the three instantaneous voltage values of phase-phase loop electric signals at the compensation point q in the condition of two phases to ground fault involving phases B and C.
Figure 11:
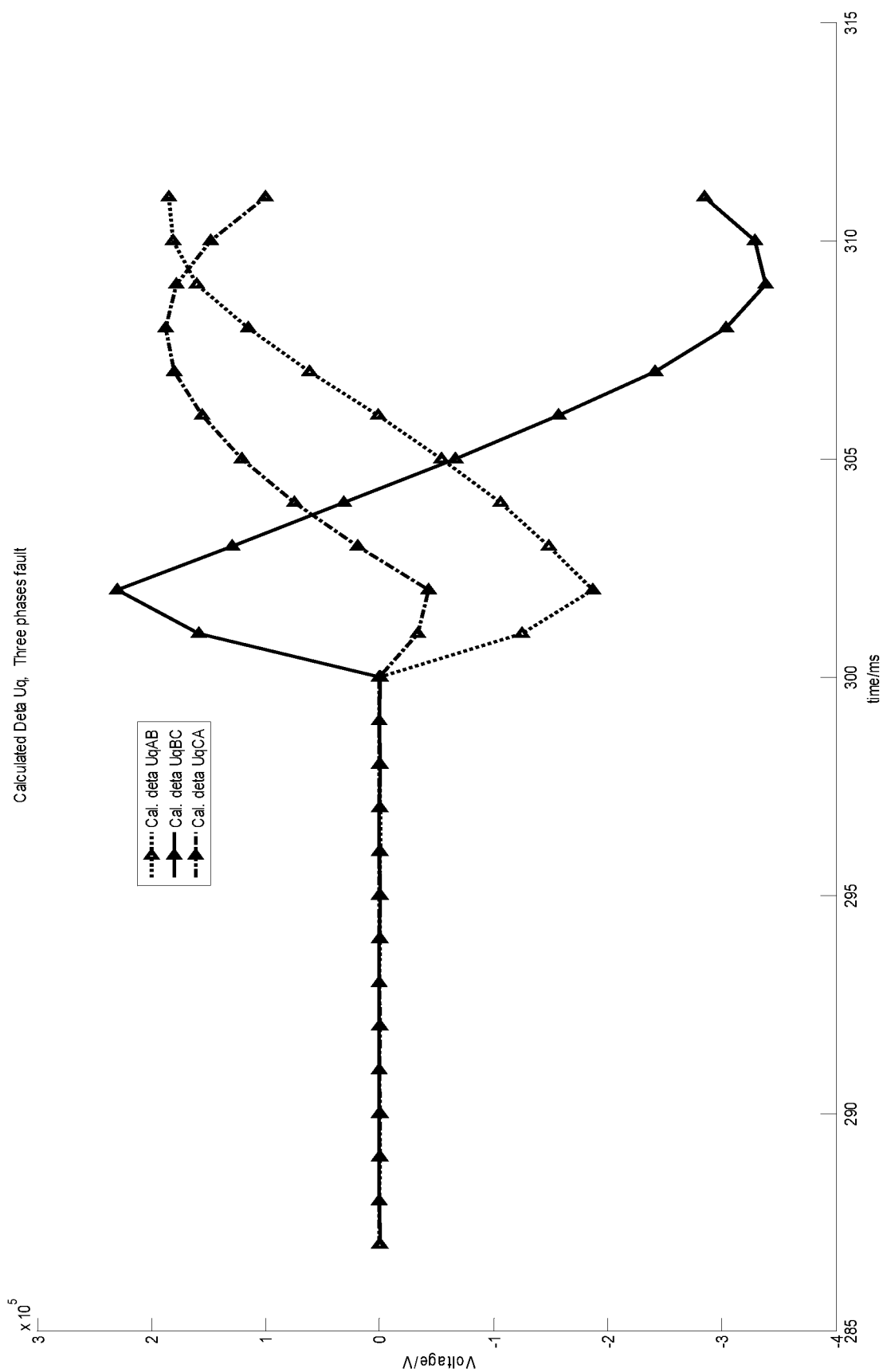
FIG. 11 shows a computed fault component or sudden-change of the instantaneous voltage value of each of the phase-phase loop electrical signals at the compensation point q in the condition of the two phases to ground fault.

FIG. 10 shows the three instantaneous voltage values of phase-phase loop electric signals at the compensation point q in the condition of two phases to ground fault involving phases B and C. FIG. 11 shows a computed fault component or sudden-change of the instantaneous voltage value of each of the phase-phase loop electrical signals at the compensation point q in the condition of the two phases to ground fault. In this case where the two phases to ground fault involving phases B and C is described as an example. It should be understood that the following description also applies with respect to two phases to ground fault occurring to phases A and B/phases C and A.

As shown in FIG. 10, the diagram UqA shows the temporal curve of the actual voltage of phase A at the compensation point q $U_{qa}$ where no fault has occurred, and the diagrams UqB and UqC respectively show the temporal curves of the actual voltages of phase B and phase C at the compensation point q, $U_{qb}$ and $U_{qc}$, before and after the occurrence of the short circuit at t0 (300 ms). The diagrams UqAB, UqBC, UqCA respectively show the temporal curves of the actual voltage values of phase-phase loop involving phases A and B, phases B and C, and phases C and A, $U_{qab}$, $U_{qbc}$ and $u_{qca}$. It can be seen that the voltage magnitude of phase B to phase C $U_{qbc}$ changes suddenly with the start of the short circuit at t0 and then progresses with deviation from it should have been without the occurrence of the fault; the magnitudes of phase-phase voltages $U_{qab}$ and $U_{qca}$ also change suddenly with the start of the short circuit at t0 but in a less magnitude than that of phase-phase voltage $U_{qbc}$.

As shown in FIG. 11, diagrams deta UqAB, deta UqBC and deta UqCA respectively relate to the computed fault component or sudden-change of the instantaneous voltage value of each of the phase-phase loop electrical signals $\Delta U_{qab}$, $\Delta U_{qbc}$ and $\Delta U_{qca}$ at the compensation point q. The respective change quantities can therefore be computed by establishing the difference between the discrete values for pre-fault and after-fault voltages UqAB, UqBC, UqCA according to equation (13).

In addition, the pre-fault phase-phase voltages $U_{q\_ab\_k-n}$, $U_{q\_bc\_k-n}$, $U_{q\_ca\_k-n}$ have to be stored in a storage circuit 18 performing the fault evaluation for the duration of at least one full fundamental frequency cycle T so as to be able to compute the curve of the fault component or sudden-change of phase-phase voltages.

Due to the characteristics of two phase to ground fault with phases B and C, it can also be obtained that:

$$\Delta U_{qbc} = \sqrt{3}\Delta U_{qca} = \sqrt{3}U\Delta U_{qab} \quad (20)$$

By sorting $\Delta U_{qab}$, $\Delta U_{qac}$ and A $U_{qca}$ by the amplitude to (M1, M2, M3), a single phase-phase fault can be identified, whatever the faulty phases are, by:

$$M1 = \sqrt{3}M2 = \sqrt{3}M3 \quad (21)$$

Based on equation (21), a two phases to ground fault can be identified, for example by the controller 17, from a fault type group in consideration of the changes of the instantaneous voltage values for the three phase-phase loop electrical signals $\Delta U_{qab}$, $\Delta U_{qbc}$ and $\Delta U_{qca}$, and a first fault signal can be thus generated indicating the identified fault type, a single two phases to ground fault, from a fault type group including: single phase fault, phase-phase fault, two phases to ground fault, and three phase fault.

Three Phases Fault Identification

Figure 12:
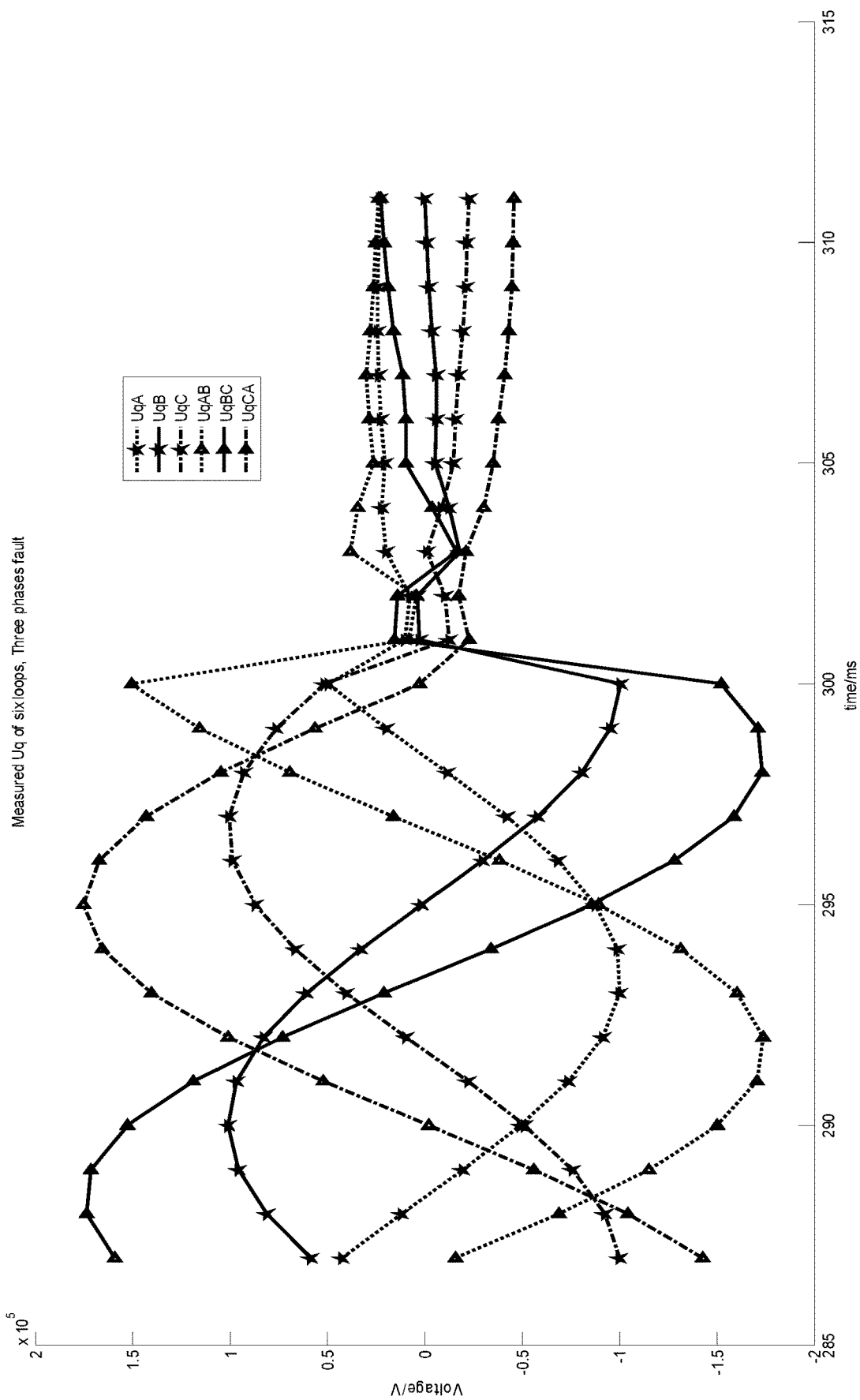
FIG. 12 shows the three instantaneous voltage values of phase-phase loop electric signals at the compensation point q in the condition of three-phase fault involving phases A, B and C.
Figure 13:
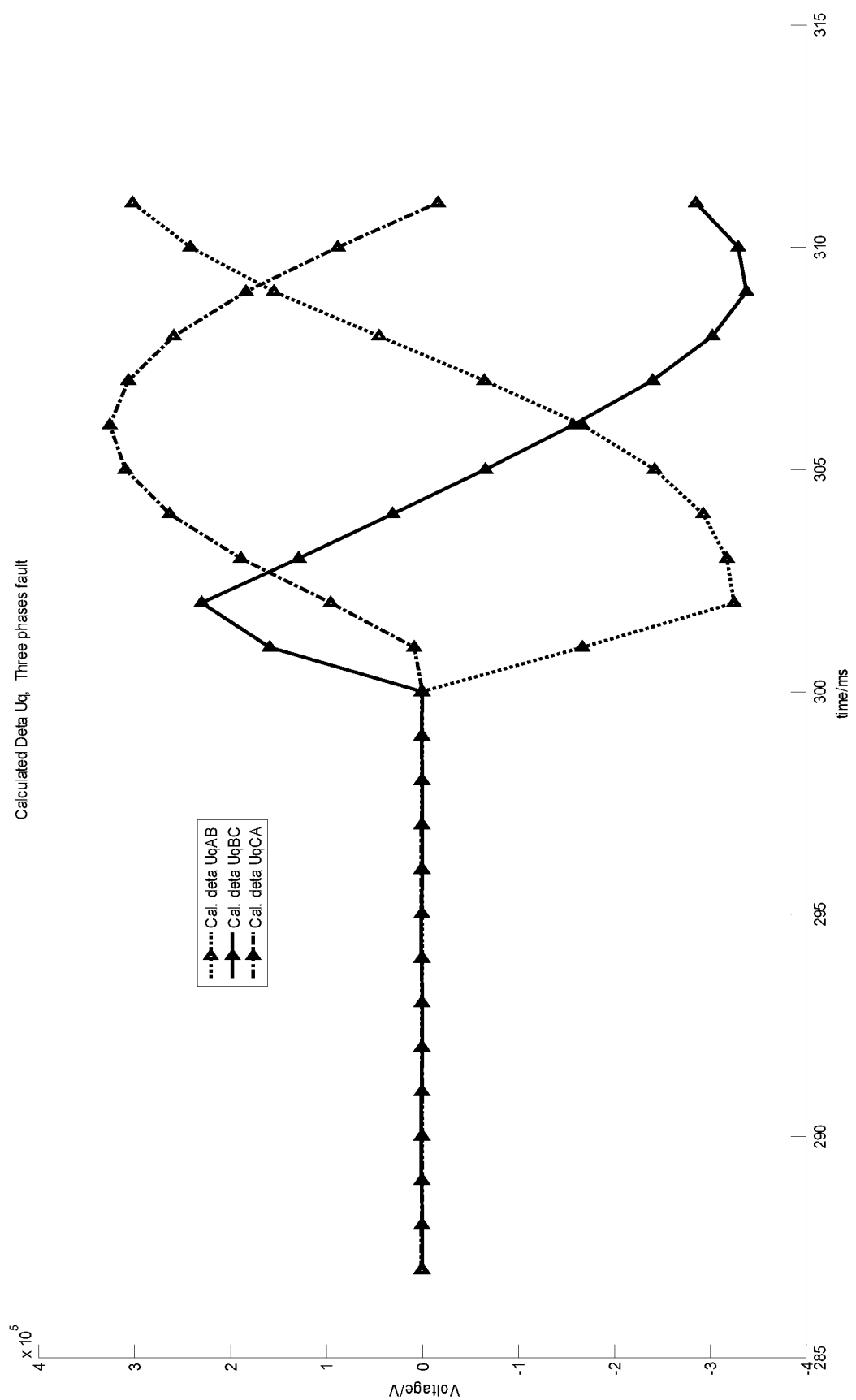
FIG. 13 shows a computed fault component or sudden-change of the instantaneous voltage value of each of the phase-phase loop electrical signals at the compensation point q in the condition of the three-phase fault.

FIG. 12 shows the three instantaneous voltage values of phase-phase loop electric signals and three instantaneous voltage values of phase-ground loop electric signals at the compensation point q in the condition of three-phase fault involving phases A, B and C. FIG. 13 shows a computed fault component or sudden-change of the instantaneous voltage value of each of the phase-phase loop electrical signals at the compensation point q in the condition of the three-phase fault.

As shown in FIG. 12, the diagrams UqA, UqB and UqC respectively show the temporal curves of the actual voltages of phase B and phase C at the compensation point q, $U_{qb}$ and $U_{qc}$, before and after the occurrence of the short circuit at t0 (300 ms). The diagrams respectively show the temporal curves of the actual voltage values of phase-phase loop involving phases A and B, phases B and C, and phases C and A, $U_{qab}$, $U_{qbc}$ and $U_{qca}$. As shown in FIG. 12, it can be seen that the magnitudes of three phase-phase voltages $U_{qab}$, $U_{qbc}$ and $U_{qca}$ change suddenly with the start of the short circuit at t0 and then progresses with deviation from it should have been without the occurrence of the fault.

As shown in FIG. 13, diagrams deta UqAB, deta UqBC and deta UqCA respectively relate to the computed fault component or sudden-change of the instantaneous voltage value of each of the phase-phase loop electrical signals $\Delta U_{qab}$, $\Delta U_{qbc}$ and $\Delta U_{qca}$ at the compensation point q. The respective change quantities can therefore be computed by establishing the difference between the discrete values for pre-fault and after-fault voltages UqAB, UqBC, UqCA according to equation (13).

In addition, the pre-fault phase-phase voltages $U_{q\_ab\_k-n}$, $U_{q\_bc\_k-n}$, $U_{q\_ca\_k-n}$ have to be stored in a storage circuit 18 performing the fault evaluation for the duration of at least one full fundamental frequency cycle T so as to be able to compute the curve of the fault component or sudden-change of phase-phase voltages.

Due to the characteristics of three-phase fault, it can be obtained that:

$$\Delta U_{qab} = \Delta U_{qbc} = \Delta U_{qca} \quad (22)$$

By sorting sort $\Delta U_{qab}$, $\Delta U_{qbc}$ and $\Delta U_{qca}$ by the amplitude to (M1, M2, M3), a single phase-phase fault can be identified by:

$$M1 = M2 = M3 \quad (23)$$

Based on equation (23), a three phases fault can be identified, for example by the controller 17, from a fault type group in consideration of the changes of the instantaneous voltage values for the three phase-phase loop electrical signals $\Delta U_{qab}$, $\Delta U_{qbc}$ and $\Delta U_{qca}$, and a first fault signal can be thus generated indicating the identified fault type, a three-phase fault, from a fault type group including: single phase fault, phase-phase fault, two phases to ground fault, and three phase fault.

Alternative to the Single Phase Fault Identification

Besides the embodiment for single phase fault identification as described above, where the single phase fault can be identified in consideration of the arithmetic relationship among the changes of the instantaneous voltage values for the three phase-phase loop electrical signals $\Delta U_{qab}$, $\Delta U_{qbc}$ and $\Delta U_{qca}$, an alternative embodiment is described thereafter in consideration of the changes of the three phase-ground loop electrical signals $\Delta U_{qa}$, $\Delta U_{qb}$ and $\Delta U_{qc}$.

Figure 14:
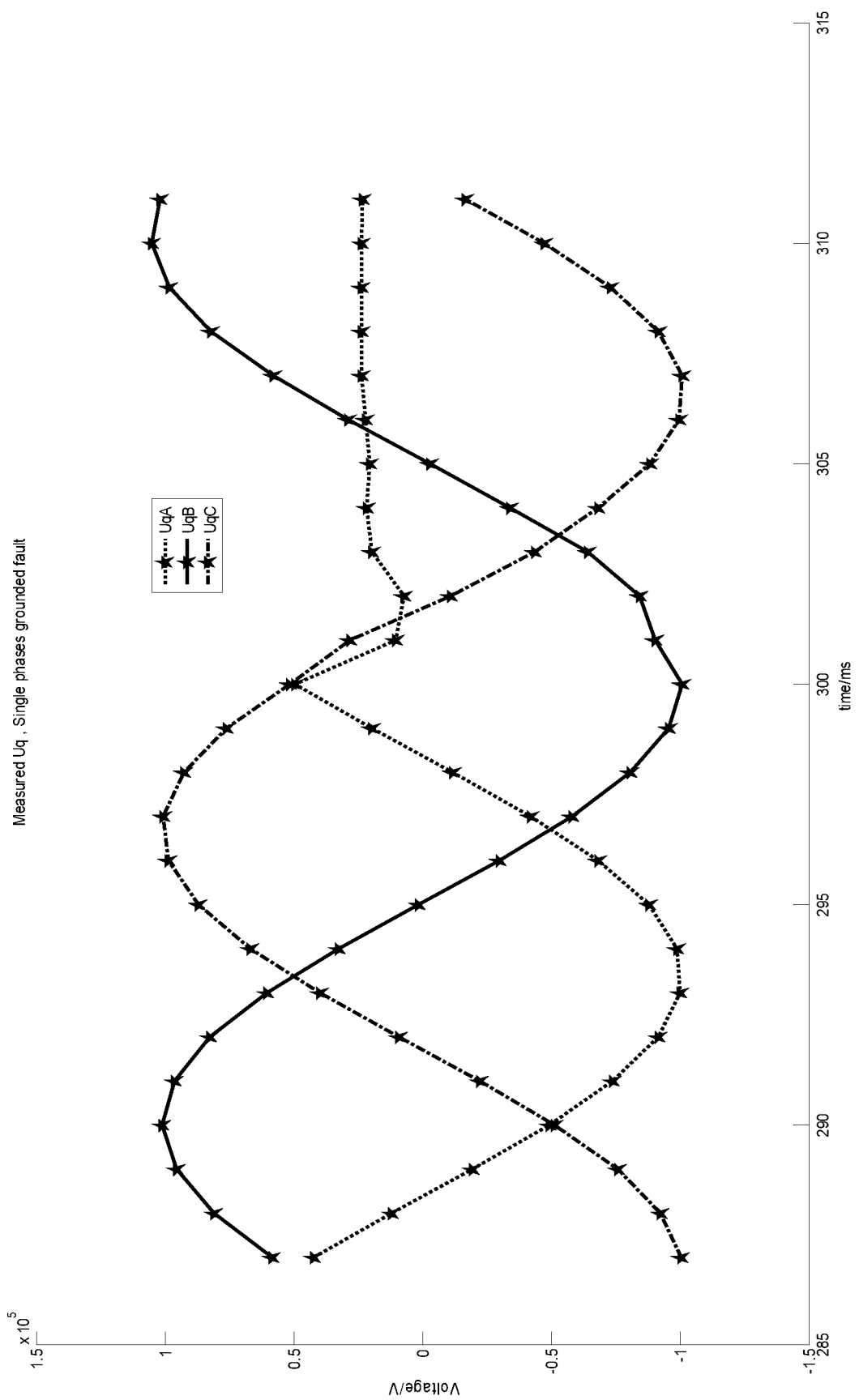
FIG. 14 shows the three instantaneous voltage values of phase-ground loop electric signals at the compensation point q in the condition of faulty phase A.
Figure 15:
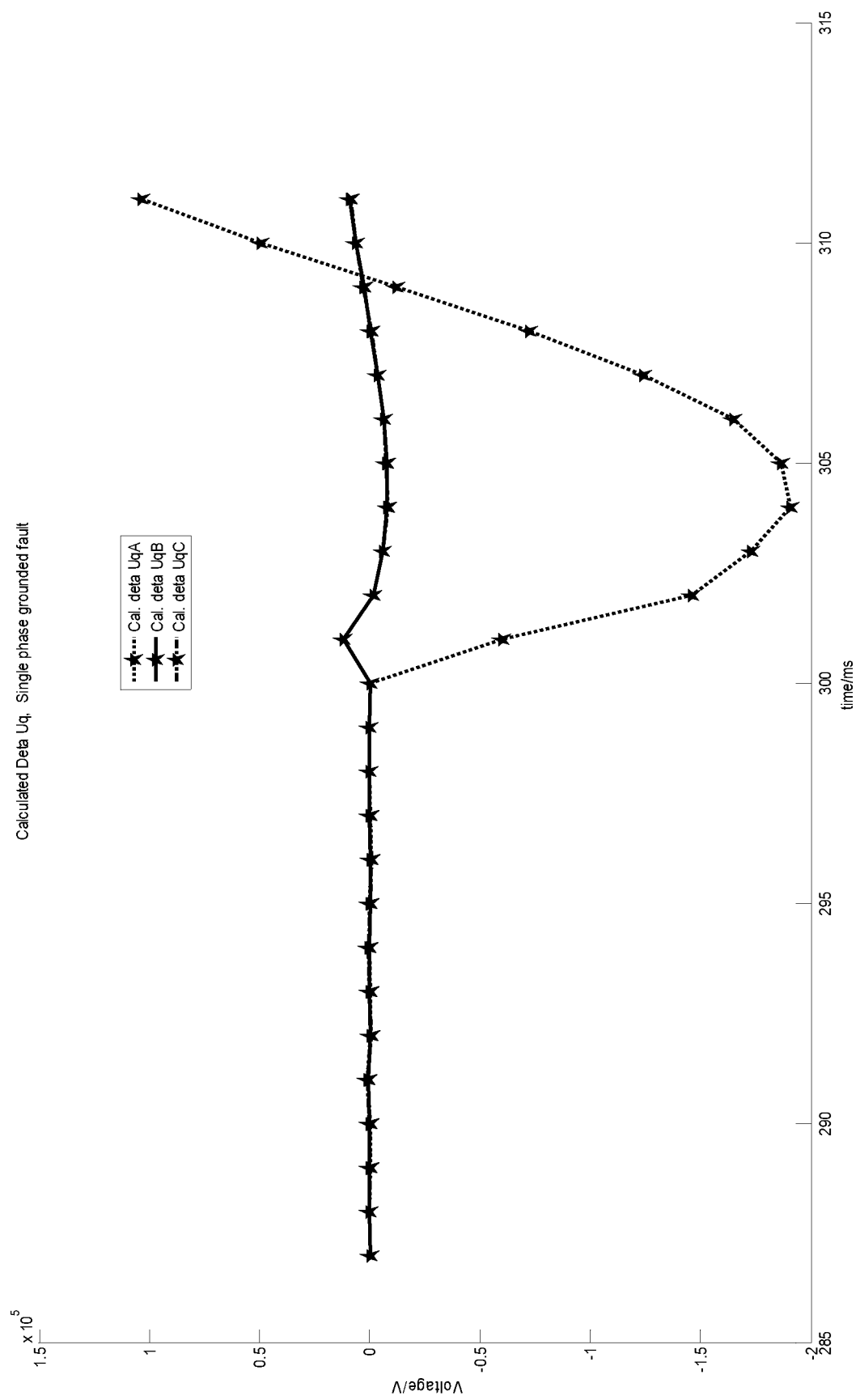
FIG. 15 shows a computed fault component or sudden-change of the instantaneous voltage value of each of the phase-ground loop electrical signals at the compensation point q in the condition of faulty phase A.

FIG. 14 shows the three instantaneous voltage values of phase-ground loop electric signals at the compensation point q in the condition of faulty phase A. FIG. 15 shows a computed fault component or sudden-change of the instantaneous voltage value of each of the phase-ground loop electrical signals at the compensation point q in the condition of faulty phase A. In this case where the single phase fault of phase A is described as an example. It should be understood that the following description also applies with respect to single phase fault occurring to phases B and C. As shown in FIG. 14, it can be seen that the magnitude of phase A to ground voltage $U_{qa}$ drops suddenly with the start of the short circuit at t0 and then progresses with deviation from it should have been without the occurrence of the fault.

As shown in FIG. 14, the diagram UqA shows the temporal curve of the actual voltage of phase A at the compensation point q $U_{qa}$ before and after the occurrence of the short circuit at t=0. The diagrams UqB and UqC respectively show the temporal curves of the actual voltages of phase B and phase C at the compensation point q, $U_{qb}$ and $U_{qc}$, where no fault has occurred. As shown in FIG. 15, diagrams deta UqA, deta UqB and deta UqC respectively relate to the fault component or sudden-change of the instantaneous voltage value of each of the phase-ground loop electrical signals $\Delta U_{qa}$, $\Delta U_{qb}$ and $\Delta U_{qc}$ at the compensation point q. The respective change quantities can therefore be computed by establishing the difference between the curves for pre-fault and after-fault voltages UqA, UqB, UqC as below:

$$\begin{cases} \Delta U_{qa} = U_{q\_a\_k} - U_{q\_a\_k-n} \\ \Delta U_{qb} = U_{q\_b\_k} - U_{q\_b\_k-n} \\ \Delta U_{qc} = U_{q\_c\_k} - U_{q\_c\_k-n} \end{cases} \quad (24)$$

wherein, k-n indicates the k-nth sampling instant, k indicates the kth sampling instant, and k-n precedes k by at least one the AC power system fundamental frequency cycle T, for example 20 ms, and k-n precedes k by at least one the AC power system fundamental frequency cycle T, for example 20 ms.

As described, the computed three instantaneous voltage values of phase-ground loop electric signals $U_{q\_a\_k-n}$ and $U_{q\_a\_k}$ can be computed based on the principle of a time domain lumped parameter differential equation for the transmission line and consequently the pre-fault value $U_{q\_a\_k-n}$, $U_{q\_b\_k-n}$ and $U_{q\_c\_k-n}$ has to be stored in a storage circuit 18 performing the fault evaluation for the duration of at least one full fundamental frequency cycle T so as to be able to retrieve it when computing the voltage change $\Delta U_{qa}$, $\Delta U_{qb}$ and $\Delta U_{qc}$.

Consequently, the fault feature of single phase fault with phase A can be expressed as below:

$$\Delta U_{qa} = \max(\Delta U_{qa}, \Delta U_{qb}, \Delta U_{qc}) \quad (25)$$

Due to similar reasons, the expressions as below are true for single phase fault with phase B or phase C:

$$\Delta U_{qb} = \max(\Delta U_{qa}, \Delta U_{qb}, \Delta U_{qc}) \quad (26)$$

$$\Delta U_{qc} = \max(\Delta U_{qa}, \Delta U_{qb}, \Delta U_{qc}) \quad (27)$$

Based on equations (25) to (27), a single phase fault can be identified, for example by the controller 17, from a fault type group in consideration of the changes of the instantaneous voltage values for the three phase-ground loop electrical signals $\Delta U_{qa}$, $\Delta U_{qb}$ and $\Delta U_{qc}$, and a first fault signal can be thus generated indicating the identified fault type, a single-phase fault, from a fault type group including: single phase fault, phase-phase fault, two phases to ground fault, and three phase fault.

Faulty Phase Identification for Single Phase Fault

From the description of embodiment in connection with the Alternative to the Single Phase Fault Identification, the skilled person should understand that the three single-phase instantaneous voltage values of single-phase loop electric signals at the compensated points $\Delta U_{qa}$, $\Delta U_{qb}$ and $\Delta U_{qc}$ can be computed from the values of the sampled electric signals based on a time domain lumped parameter differential equation for the transmission line for a series of time points. It can be seen that in the condition that the phase A to ground voltage $U_{qa}$ drops suddenly with the start of the short circuit and then progresses with an accordingly lower amplitude, and the phase B/C to ground voltage $\Delta U_{qb}$ and $\Delta U_{qc}$ keeps zero because this loop has nothing to do with the fault.

Consequently, the fault feature of single phase fault with phase A can be expressed as below:

$$\Delta U_{qa} > (\Delta U_{qb}, \Delta U_{qc}) \quad (28)$$

For the single-phase fault occurs at phase B and phase C, the following equations apply:

$$\Delta U_{qb} > (\Delta U_{qa}, \Delta U_{qc}) \quad (29)$$

$$\Delta U_{qc} > (\Delta U_{qb}, \Delta U_{qb}) \quad (30)$$

Based on the truth of equations (28), (29) and (30), it can identify which of the three phases A, B and C has a single-phase fault, for example by the controller 17, and generates a second fault signal indicating the identified faulty phase. For example, if equation (28) is truth, then it is identified that the single-phase fault occurring at phase A; if equation (29) is truth, then it is identified that the single-phase fault occurring at phase B; if equation (30) is truth, then it is identified that the single-phase fault occurring at phase C. In summary, the identification of the faulty phase considers arithmetic relationship among the changes of the single-phase instantaneous voltage values concerning the single-phase loop electric signals.

The changes of the instantaneous voltage values of the phase-phase/phase-ground loop electrical signals at the compensation point may thus be used for identification of the fault type from the fault type group comprising types of single phase fault, phase-phase fault, two phases to ground fault, and three phase fault, which are computed in consideration of the magnitudes of sampling electric signals of the three phases at one end of the transmission line at a series of time points. In order to have a satisfactory precision of the computed changes with respect to changes of the voltages accentually occur at the compensation point, the embodiments of present invention are implemented in terms of the time domain lumped parameter differential equation establishing a mathematical link therebetween. The time domain lumped parameter differential equation has advantage in that it is workable at a relatively low sampling rate, without compromising the precision of the computation result too much. Experiment data show that the faulty phase detection solutions according to present invention can operate at a relatively low sampling rate ranging from 0.6 kHz to 4 kHz with desirable reliability and sensitivity. In this case, because the faulty phase selection is based on a comparison of changes of phase-ground/phase-phase loop voltages, it imposes less restriction on the precision of the computation results. Consequently, from an optimization design point of view, usage of the time domain lumped parameter differential equation is preferred in that it lowers the sampling rate while meeting the degraded constraints for computation precision. The decision made by the protective relay regarding the presence of a short circuit can thus have a relatively high adaptability and acceptable reliability and sensitivity because it is possible to lower the sampling rate while maintaining a satisfactory computation precision. The time domain lumped parameter differential equations (9) to (12) initially allow a computation of instantaneous values, which could be tainted by measurement errors, outliers or random fluctuations. Instantaneous values therefore might not provide a reliable basis for fault evaluation. For this reason, it is proposed to perform the assessment on the basis of rectified phase selection algorithm.

As for the phase selection algorithm of equation (17) for single-phase fault identification, it is established by adjusting:

$$\begin{cases} M1 = (0.8 * M2, 1.2 * M2) \\ M3 = (0, 0.2 * M2) \end{cases} \quad (31)$$

As for the phase selection algorithm of equation (21) for single phase-phase fault identification, it is established by:

$$M1 = (0.8 * \sqrt{3} M2, 1.2 * \sqrt{3} M2) = (0.8 * \sqrt{3} M3, 1.2 * \sqrt{3} M3) \quad (32)$$

As for the phase selection algorithm of equation (23) for three-phase fault identification, it is established by:

$$M1 = (0.8 M2, 1.2 M2) = (0.8 M3, 1.2 M3) \quad (33)$$

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for detecting faulted phases of three phases of a transmission line of an AC power system, the method comprising:
   sampling electric signals including currents and voltages at one end of the transmission line at a series of time points;
   computing instantaneous voltage values of electric signals at a preset compensated point on the transmission line from values of the sampled electric signals based on a time domain lumped parameter differential equation for the transmission line for the series of time points;
   recording the computed instantaneous voltage values of the electric signals at the preset compensated point;
   determining pre-fault instantaneous voltage values at a first time point of the series of time points;
   determining post-fault instantaneous voltage values at a second time point of the series of time points;
   computing fault component instantaneous voltage values of the electrical signals based on the pre-fault and post-fault instantaneous voltage values at the preset compensated point;
   detecting faulted phases and fault type by comparing each of the calculated fault component instantaneous voltage values at the preset compensated point; and
   generating fault signals indicating the faulted phases or fault types;
   wherein the computed instantaneous voltage values comprise phase-phase instantaneous voltage values corresponding to each phase-phase loop electric signal and phase-ground instantaneous voltage values corresponding to each phase-ground loop electric signal; and
   wherein the computed fault component instantaneous voltage values comprises phase-phase fault instantaneous voltage values corresponding to each of the phase-phase loop electric signals and phase-ground fault instantaneous voltage values corresponding to each of the phase-ground loop electric signals.

2. The method according to claim 1, wherein:
detecting the faulted phases considers an arithmetic relationship among phase-phase fault component instantaneous voltage values for each phase-phase loop electrical signal.

3. The method according to claim 1, wherein:
detecting the fault types comprises detecting single phase faults, phase-phase faults, two phases to ground faults, and three phase faults.

4. The method according to claim 1, further comprising:
computing single-phase instantaneous voltage values of each single-phase loop electric signal at the compensated point on the transmission line from the values of the sampled electric signals based on a time domain lumped parameter differential equation for the transmission line for the series of time points;
recording the computed single-phase instantaneous voltage values of each single-phase loop electric signal;
determining pre-fault single-phase instantaneous voltage values at the first time point of the series of time points;
determining post-fault single-phase instantaneous voltage values at the second time point of the series of time points;
computing single-phase fault component instantaneous voltage values of the single-phase instantaneous voltage values at the preset compensated point of each single-phase loop electrical signal based on the difference between the pre-fault single-phase instantaneous voltage values and the post-fault single-phase instantaneous voltage values; and
identifying which of the three phases has a single-phase fault in consideration of an arithmetic relationship among single-phase fault component instantaneous voltage values and phase-phase fault component instantaneous voltage values.

5. The method according to claim 1, wherein further comprising:
computing single-phase instantaneous voltage values of each single-phase loop electric signal at the compensated point on the transmission line from the values of the sampled electric signals based on a time domain lumped parameter differential equation for the transmission line for the series of time points;
recording the computed single-phase instantaneous voltage values of each single-phase loop electric signal;
determining pre-fault single-phase instantaneous voltage values at the first time point of the series of time points;
determining post-fault single-phase instantaneous voltage values at the second time point of the series of time points; and
computing single-phase fault component instantaneous voltage values of each single-phase loop electrical signal based on the difference between the pre-fault single-phase instantaneous voltage values and the post-fault single-phase instantaneous voltage values.

6. The method according to claim 5, wherein:
the identification of the faulted phases further considers an arithmetic relationship among the single-phase fault component instantaneous voltage values of each of the single-phase loop electrical signals.

7. The method according to claim 1, wherein:
the second time point is a current time point; and
the first time point occurs before occurrence of the second time point by at least one period of a fundamental frequency cycle of the AC power system.

8. The method according to claim 1, wherein:
the time domain lumped parameter differential equation is based on Resistor-Inductor-Capacitor (RLC) model or Resistor-Inductor (RL) model.

9. The method of claim 1, further comprising using the fault signals indicating the faulted phases or fault types as a tripping signal to disconnect the faulted phases.

10. The method of claim 1, wherein the fault component instantaneous voltage values are rectified prior to detecting the faulted phases and the fault type.

11. A control system for detecting faulted phases of transmission line in a three phase AC power system, comprising:
a sampling circuit, for sampling electric signals including currents and voltages at one end of the transmission line at a series of time points;
a controller, for computing instantaneous voltage values of electric signals at a preset compensated point on the transmission line from values of the sampled electric signals based on a time domain lumped parameter differential equation for the transmission line for the series of time points; and
a storage circuit, for recording the computed the instantaneous voltage or current values of the electric signals;
wherein the controller is further adapted for determining a fault based on the computed instantaneous voltage values, determining pre-fault instantaneous voltage values at a first time point of the series of time points, determining post-fault instantaneous voltage values at a second time point of the series of time points, using the difference between the pre-fault and the post-fault instantaneous voltage values to compute fault component instantaneous voltage values at the preset compensated point, computing fault component instantaneous voltage values, detecting the faulted phases and fault type based on the fault component instantaneous voltage values, and generating a first fault signal indicating the detected fault type.

12. The control system according to claim 11, wherein:
the computed instantaneous voltage values comprise phase-phase instantaneous voltage values corresponding to each phase-phase loop electric signal; and
the computed fault component instantaneous voltage values comprise phase-phase fault component instantaneous voltage values corresponding to each of the phase-phase loop electric signals.

13. The control system according to claim 12, wherein:
the identification of the fault type from the fault type group further considers an arithmetic relationship among phase-phase fault component instantaneous voltage values for each phase-phase loop electrical signal.

14. The control system according to claim 12, wherein:
detecting the fault type comprises detecting single phase faults, phase-phase fault faults, two phases to ground faults, and three phase faults.

15. The control system according claim 11, wherein:
the controller is further adapted for computing single-phase instantaneous voltage values of single-phase loop electric signals at the compensated point of the transmission line from the values of the sampled electric signals based on a time domain lumped parameter differential equation for the transmission line for the series of time points;
the storage circuit is further adapted for recording the computed single-phase instantaneous voltage values of the single-phase loop electric signals; and the controller is further adapted for computing pre-fault single-phase instantaneous voltage values at the first time point of the series of time points, computing post-fault single-phase instantaneous voltage values at the second time point of the series of time points, computing single-phase fault component instantaneous voltage values based on the difference between the post-fault single-phase instantaneous voltage values and the pre-fault single-phase instantaneous voltage values, identifying which of the three phases have a single-phase fault in consideration of an arithmetic relationship among the single-phase fault component instantaneous voltage values and phase-phase fault component instantaneous voltage values, and generating a second fault signal indicating the identified faulty phase.

16. The control system of claim 15, wherein the controller is further adapted to send the second fault signal to the circuit breaker.

17. The control system according to claim 11, wherein:
the controller is further adapted to compute pre-fault single-phase instantaneous voltage values for each single-phase loop electric signal at the first time point at the preset compensated point on the transmission line from the values of the sampled electric signals based on a time domain lumped parameter differential equation for the transmission line for the series of time points;
the storage circuit is further adapted to record the computed pre-fault single-phase instantaneous voltage values of the electric signals at the preset compensated point; and
the controller is further adapted for determining pre-fault single-phase instantaneous voltage values at the first time point of the series of time points, determining post-fault single-phase instantaneous voltage values at the second time point of the series of time points, computing single-phase fault component instantaneous voltage values of the electrical signals based on the difference between the pre-fault and post-fault single-phase fault component instantaneous voltage values.

18. The control system according to claim 17, wherein:
the identification of the faulted phase further considers arithmetic relationship among the single-phase fault component instantaneous voltage values.

19. The control system according to claim 11, wherein:
the second time point is current time point; and
the first time point occurs before occurrence of the second time point by at least one period of a fundamental frequency cycle of the AC power system.

20. The control system according to claim 11, wherein:
the time domain lumped parameter differential equation is based on Resistor-Inductor-Capacitor (RLC) model or Resistor-Inductor (RL) model.

21. A protective relay comprising:
the control system according to claim 11; and
a related hardware device, wherein the protective relay is configured to disconnect an affected phase based on the fault signal generated by the controller using the related hardware device.

22. The control system of claim 11, wherein the controller is further adapted to send the first fault signal to a circuit breaker.

23. The control system of claim 11, wherein the controller is further adapted to rectify the fault component instantaneous voltage values prior to detecting the faulted phases and the fault type.

24. A method for detecting faulted phases of three phases of transmission line of an AC power system, comprising:
sampling electric signals including currents and voltages at one end of the transmission line at a series of time points;
calculating instantaneous voltage values corresponding to each phase-phase loop electric signal and each phase-ground loop electric signal at a preset compensated point on the transmission line for the series of time points;
storing the instantaneous voltage values;
determining an occurrence of a fault based on the computed instantaneous voltage values;
determining pre-fault instantaneous voltage values at a first time point of the series of time points and post-fault instantaneous voltage values at a second time point of the series of time points, the second time point occurring after the first time point;
determining fault component instantaneous voltage values based on a difference between corresponding values of the post-fault instantaneous voltage values and the pre-fault instantaneous voltage values;
determining rectified fault component instantaneous voltage values;
detecting the faulted phases and the fault types that occurred, wherein the determined fault type comprises at least one of: single phase faults, phase-phase faults, two phases to ground faults, and three phase faults by comparing the rectified fault component instantaneous voltage values at the preset compensated point based on a phase selection algorithm;
generating fault signals indicating the fault types or the faulted phases; and
using the fault signals indicating the fault types or faulted phases as a tripping signal to disconnect the faulted phases.

* * * * *

UNITED STATES PATENT AND TRADEMARK OFFICE
CERTIFICATE OF CORRECTION

PATENT NO. : 11,022,655 B2
APPLICATION NO. : 16/174701
DATED : June 1, 2021
INVENTOR(S) : Kai Liu Page 1 of 1

It is certified that error appears in the above-identified patent and that said Letters Patent is hereby corrected as shown below:

In the Claims

In Claim 5, Column 17; Line 38 delete "wherein"

In Claim 14, Column 18; Line 55 delete "fault"

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*